(12) United States Patent
Sawada et al.

(10) Patent No.: US 6,341,089 B1
(45) Date of Patent: Jan. 22, 2002

(54) SEMICONDUCTOR MEMORY DEVICE ALLOWING EFFECTIVE DETECTION OF LEAK FAILURE

(75) Inventors: Seiji Sawada; Kiyohiro Furutani; Mikio Asakura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/753,452

(22) Filed: Jan. 4, 2001

(30) Foreign Application Priority Data

Jun. 29, 2000 (JP) ............................................ 12-195971

(51) Int. Cl.[7] ................................................. G11C 7/00
(52) U.S. Cl. ........................ 365/191; 365/194; 365/233
(58) Field of Search ................................. 365/191, 193, 365/194, 201, 233

(56) References Cited

U.S. PATENT DOCUMENTS

| | | | | |
|---|---|---|---|---|
| 5,528,552 A | * | 6/1996 | Kamisaki | 365/238.5 |
| 5,673,231 A | * | 9/1997 | Furutani | 365/203 |
| 5,848,008 A | | 12/1998 | Kirihata et al. | 365/200 |
| 5,903,512 A | | 5/1999 | Wong et al. | 365/233 |
| 6,046,956 A | * | 4/2000 | Yabe | 365/230.06 |
| 6,259,640 B1 | | 7/2001 | Endo et al. | 365/201 |

FOREIGN PATENT DOCUMENTS

| | | |
|---|---|---|
| JP | 11-39899 | 2/1999 |
| JP | 11-149800 | 6/1999 |
| JP | 11-162195 | 6/1999 |

* cited by examiner

*Primary Examiner*—Son Mai
(74) *Attorney, Agent, or Firm*—McDermott, Will & Emery

(57) ABSTRACT

An internal signal RAS generated in accordance with command input and indicating activation of a row is delayed in accordance with a dock signal int.CLKI, and thereby a sense amplifier activating signal is issued. A time from activation of a word line by a signal WLT to activation of a sense amplifier can be longer than that in a normal case so that a minute leak from a bit line can be detected.

8 Claims, 15 Drawing Sheets

FIG. 5

| COMMAND / INPUT SIGNAL | Ext./CS | Ext./RAS | Ext./CAS | Ext./WE |
|---|---|---|---|---|
| NOP | H | X | X | X |
| NOP | L | H | H | H |
| ACT | L | L | H | H |
| PRE | L | L | H | L |
| READ | L | H | L | H |
| WRITE | L | H | L | L |

FIG. 12

| COMMAND \ INPUT SIGNAL | Ext./CS | Ext./RAS | Ext./CAS | Ext./WE |
|---|---|---|---|---|
| NOP | X | H | H | H |
| ACT | X | L | H | H |
| PRE | X | L | H | L |
| READ | X | H | L | H |
| WRITE | X | H | L | L |

SEMICONDUCTOR MEMORY DEVICE ALLOWING EFFECTIVE DETECTION OF LEAK FAILURE

BACKGROUND OF THE INVENTION

1. Field of the Invention

The present invention relates to a semiconductor memory device, and particularly a semiconductor memory device which allows a detection test of minute bit line leak failure, and therefore has improved reliability.

2. Description of the Background Art

In a semiconductor memory device, a row is activated in a memory cell array in accordance with a command and an address which are externally applied, and data is read from the memory cell at a selected column in the activated row.

FIG. 14 shows a circuit issuing row selection timing of a semiconductor memory device in the prior art.

Referring to FIG. 14, the row selection timing generating circuit in the conventional semiconductor memory device includes an active command generating circuit 132 and a precharge command generating circuit 134 which latch control signals int./RAS, int./CAS, int./WE and int./CS in synchronization with clock signal int.CLKI, and generate an active command ACT and a precharge command PRE, respectively, NAND circuits 136 and 138 which are cross-coupled, and receive a signal /ACT sent from active command generating circuit 132 and a signal /PRE sent from precharge command generating circuit 134, respectively, a delay circuit 142 which delays a signal RAS sent from NAND circuit 136, and issues a sense amplifier activating signal SS, an inverter 146 which inverts sense amplifier activating signal SS to issue a sense amplifier activating signal /SS, a BLEQ generating circuit 148 which issues an equalize signal BLEQ in accordance with sense amplifier activating signal SS and signal RAS, and a WLT generating circuit 150 which issues a signal WLT indicating timing for activating a word line in accordance with signal RAS.

FIG. 15 is an operation waveform diagram for showing a row selecting operation of the semiconductor memory device in the prior art.

Referring to FIGS. 14 and 15, command ACT which is determined in accordance with a combination of control signals int./RAS, int./CAS, int./WE and int./CS is input at a time t1 so that active command generating circuit 132 activates signal /ACT to attain L-level. Thereby, a latch circuit formed of NAND circuits 136 and 138 latches signal /ACT to raise signal RAS from L-level to H-level.

Equalize signal BLEQ which equalizes and precharges a bit line pair is triggered by signal RAS to lower to L-level so that the bit line pair is released from the precharged state, and enters a floating state.

At a subsequent time t2, signal WLT rises to H-level, and the row decoder performing selection of the memory cell row selects one word line WLn, and sets the potential thereon to H-level. When word line WLn is activated to attain H-level, data written in the memory cell is transmitted onto the bit line pair so that a minute potential difference occurs between the paired bit lines.

At a time t4, the delay time of delay circuit 142 elapses. Thereby, sense amplifier activating signals SS and /SS are activated, and the sense amplifier operates to amplify the minute potential difference occurring on the bit line pair.

After the data is read, the bit lines are precharged again at a time t5, and the precharge command is applied for allowing a next read or write cycle.

Due to foreign substance such as dust, which was mixed in the manufacturing step, a minute leak may occur from the bit lines. In this case, the minute potential difference amplified by the sense amplifier is small. However, if an operation margin is present in the sense amplifier circuit, normal reading may be performed even when a leak from the bit line occurs to a certain extent. Even if a normal operation was performed in wafer state during an initial test, a leak may increase, e.g., in a burn-in test which is performed thereafter for removing initial failures, and therefore an operation failure may occur.

SUMMARY OF THE INVENTION

An object of the invention is to provide a semiconductor memory device, in which reliability is improved by allowing detection of a minute leak in an initial test before an acceleration test, and a manufacturing yield after the acceleration test such as a burn-in test can be improved.

In summary, the invention provides a semiconductor memory device for receiving a command in synchronization with a clock signal includes a memory array, a plurality of equalize circuits, a plurality of sense amplifiers and a control circuit.

The memory array includes a plurality of memory cells arranged in a matrix form having a plurality of rows and a plurality of columns, a plurality of word lines corresponding to the plurality of rows, respectively, and a plurality of bit line pairs corresponding to the plurality of columns, respectively. The plurality of equalize circuits apply predetermined potentials to the plurality of bit line pairs, respectively. The plurality of sense amplifiers amplify potential differences occurring on the plurality of bit line pairs, respectively. The control circuit controls reading of data from the memory array.

The control circuit includes a command recognizing portion for recognizing the command in accordance with a combination of a plurality of externally applied control signals, and issuing a timing reference signal providing a reference of timing of deactivation of the plurality of equalize circuits, activation of one of the plurality of word lines selected in accordance with an address signal, and activation of the plurality of sense amplifiers, a delay circuit for receiving and delaying the timing reference signal, and a signal delay control circuit for delaying the output of the delay circuit until activation of a first internal signal, and transmitting the delayed output to the plurality of sense amplifiers.

Accordingly, the invention can achieve the following major advantage. The signal forming the reference of the row activation is delayed during the test to a larger extent than that in the normal operation, and then is transmitted to the sense amplifier. Therefore, it is possible to detect a minute leak, which occurs between the bit lines and can not be removed in the normal operation test of the synchronous semiconductor memory device. Accordingly, the minute leak can be detected in the initial test before an acceleration test, and a burn-in test can be performed after performing replacement with a redundant memory cell row.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows commands recognized in accordance with external input signals applied to semiconductor memory device 1;

FIG. 12 shows commands recognized in accordance with external input signals applied to the semiconductor memory device of the fourth embodiment;

DESCRIPTION OF THE PREFERRED EMBODIMENTS

[First Embodiment]

Figure 1:
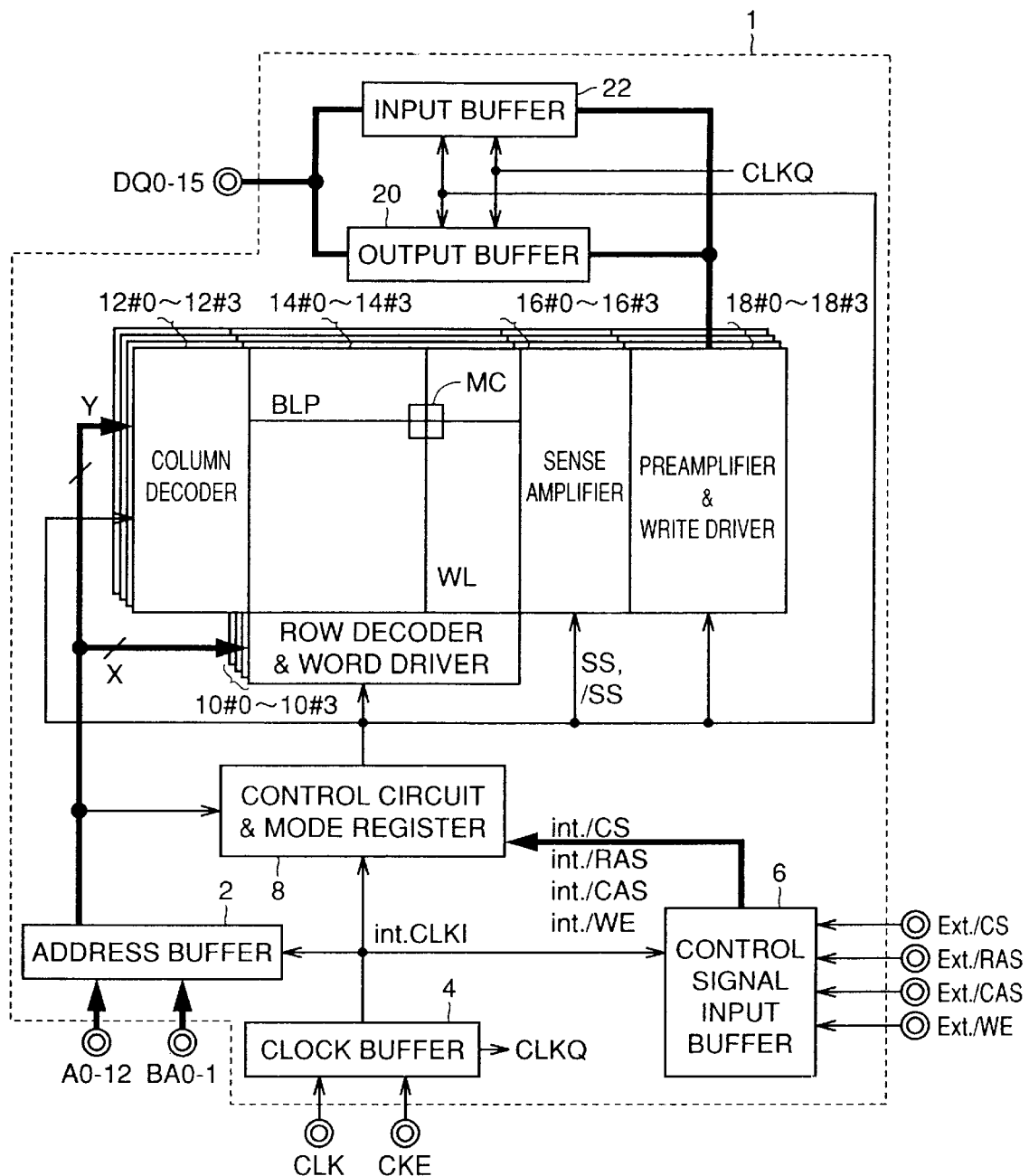
FIG. 1 is a schematic block diagram showing a structure of a semiconductor memory device 1 of a first embodiment of the invention.

FIG. 1 is a schematic block diagram showing a structure of a semiconductor memory device 1 of a first embodiment of the invention.

Referring to FIG. 1, semiconductor memory device 1 includes memory array banks 14#0–14#3 each having a plurality of memory cells arranged in rows and columns, an address buffer 2 which takes in externally applied address signals A0–A12 and bank address signals BA0–BA1 in synchronization with a clock signal CLKI, and issues an internal row address, an internal column address and an internal bank address, a clock buffer 4 which receives a clock signal CLK and a clock enable signal CKE both applied externally, and issues clock signals CLKI and CLKQ used within semiconductor memory device 1, and a control signal input buffer 6 which takes in externally applied control signals Ext./CS, Ext./RAS, Ext./CAS and Ext./WE in synchronization with clock signal CLKI.

Each of memory array banks 14#0–14#3 includes memory cells MC arranged in rows and columns, a plurality of word lines WL arranged corresponding to the rows of memory cells MC, respectively, and bit line pairs BLP arranged corresponding to the columns of memory cells MC, respectively. Each bit line pair BLP includes bit lines BL and ZBL, as will be described later.

Semiconductor memory device 1 further includes a control circuit which receives the internal address signal sent from address buffer 2 as well as control signals int./CS, int./RAS, int./CAS and int./WE, which are sent from control signal input buffer 6 and are synchronized with the clock signal, and issues control signals to each block in synchronization with clock signal CLKI, and a mode register which holds an operation mode recognized by the control circuit. FIG. 1 represents the control circuit and the mode register as one block 8.

The control circuit includes a bank address decoder which decodes internal bank address signals int.BA0 and int.BA1, a command decoder which receives and decodes control signals int.RAS, int.CAS and int.WE, and a row-related control circuit, which will be described later.

Semiconductor memory device 1 further includes row decoders which are provided corresponding to memory array banks 14#0–14#3, respectively, and decode a row address signal X sent from address buffer 2, and word drivers for driving the rows (word lines) at the designated addresses in memory array banks 14#0–14#3 to the selected state in accordance with the output signals of these row decoders. In FIG. 1, combinations of the row decoders and the corresponding word drivers are represented as blocks 10#0–10#3, respectively.

Semiconductor memory device 1 further includes column decoders 12#0–12#3 which decode an internal column address signal Y sent from address buffer 2, and issue the column select signal, and sense amplifiers 16#0–16#3 which sense and amplify the data of memory cells connected to the selected rows in memory array banks 14#0–14#3, respectively.

Semiconductor memory device 1 further includes an input buffer 22 which receives external write data and produces internal write data, write drivers which amplify and transmit the internal write data sent from internal buffer 22 to the selected memory cells, preamplifiers which amplify the data read from the selected memory cells, and an output buffer 20 which buffers and externally issues the data sent from the preamplifiers.

The preamplifiers and the write drivers are provided corresponding to memory array banks 14#0–14#3, respectively. In FIG. 1, combinations of the preamplifiers and the corresponding write drivers are represented as blocks 18#0–18#3, respectively.

Input buffer 22 takes in data DQ0–DQ15, which are externally applied to terminals, in accordance with clock signal CLKQ.

Output buffer 20 issues data DQ0–DQ15 in synchronization with clock signal CLKQ when data is to be externally output from semiconductor memory device 1.

Figure 2:
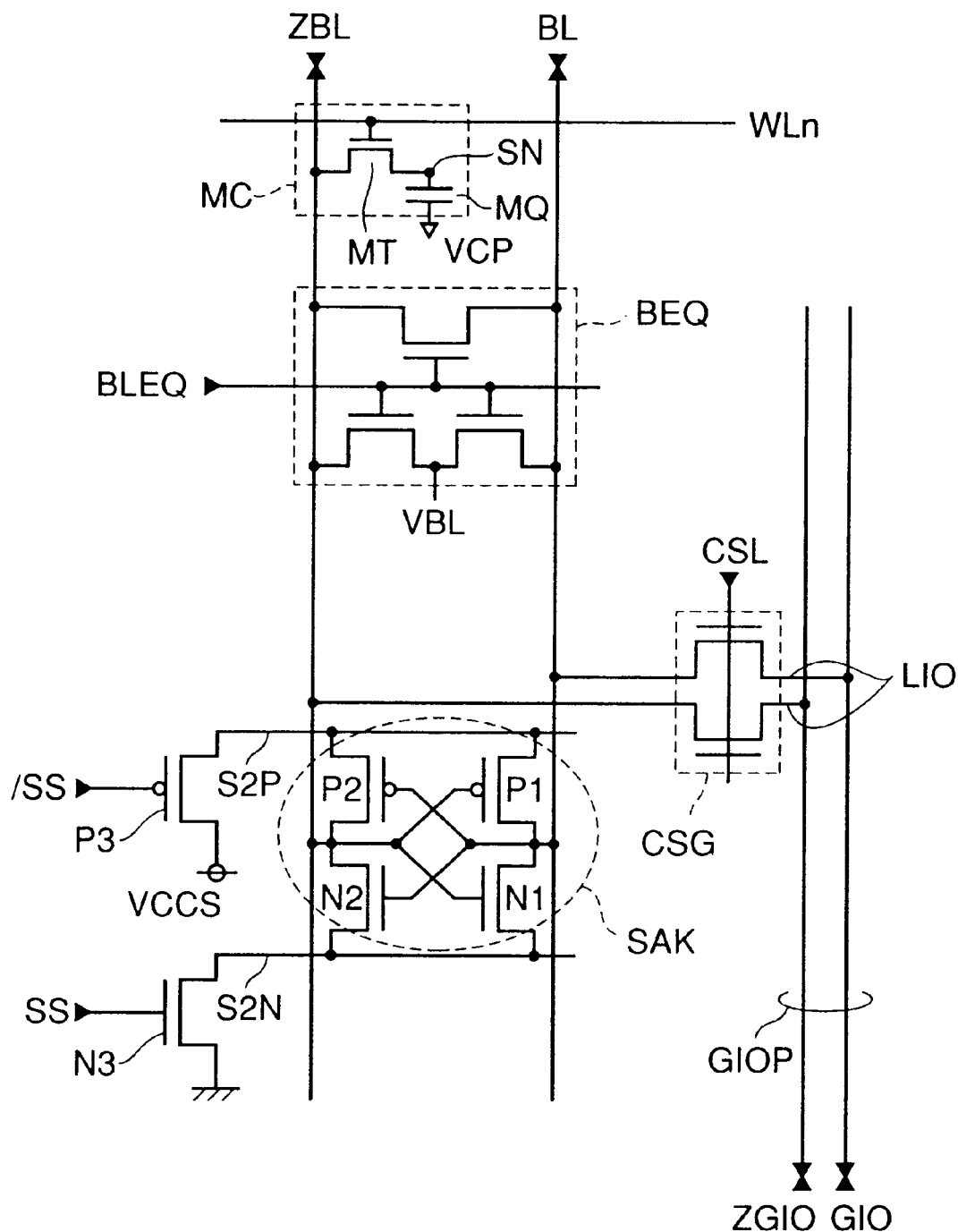
FIG. 2 is a circuit diagram showing a connection portion between a sense amplifier and a bit line pair shown in FIG. 1.

FIG. 2 is a circuit diagram showing a connection portion between the sense amplifier and the bit line pair shown in FIG. 1.

Referring to FIG. 2, bit line pair BLP which is included in the memory cell array and is shown in FIG. 1 includes bit lines BL and ZBL. Memory cell MC is arranged at a crossing between word line WLn, which is provided corresponding to each memory cell row, and one of paired bit lines BL and ZBL. FIG. 2 shows one memory cell MC as a typical example.

Memory cell MC includes an N-channel MOS transistor MT which is arranged between bit line ZBL and a storage node SN, and has a gate connected to word line WLn, and a capacitor MQ which has an end connected to storage node SN and the other end connected to a cell plate potential.

An equalize circuit BEQ, which equalizes the potentials on bit lines BL and ZBL in accordance with an equalize signal BLEQ, is arranged between bit lines BL and ZBL.

Equalize circuit BEQ includes three transistors. More specifically, it includes an N-channel MOS transistor which is turned on to connect bit lines BL and ZBL together in accordance with equalize signal BLEQ, an N-Channel MOS transistor which is turned on to couple bit line BL to an equalize potential VBL in accordance with equalize signal BLEQ, and an N-channel MOS transistor which is turned on to couple bit line BL to equalization potential VBL in accordance with equalize signal BLEQ.

A sense amplifier SAK, which is activated by transistors N3 and P3 to be turned on in accordance with sense amplifier activating signals SS and/SS, respectively, is arranged between bit lines BL and ZBL.

Sense amplifier SAK includes P- and N-channel MOS transistors P1 and N1 which are connected in series between nodes S2P and S2N, and each have a gate connected to bit line ZBL, and P- and N-channel MOS transistors P2 and N2 which are connected in series between nodes S2P and S2N, and each have a gate connected to bit line BL.

A connection node between P- and N-channel MOS transistors P1 and N1 is connected to bit line BL, and a connection node between P- and N-channel MOS transistors P2 and N2 is connected to bit line ZBL. When activated, sense amplifier SAK expands a potential difference between bit lines BL and ZBL.

A column select gate CSG, which is turned on in response to column select signal CSL according to the column address, is provided for each bit line pair so that bit lines BL and ZBL are connected to global I/O lines GIO and ZGIO via column select gate CSG in the read or write operation.

Figure 3:
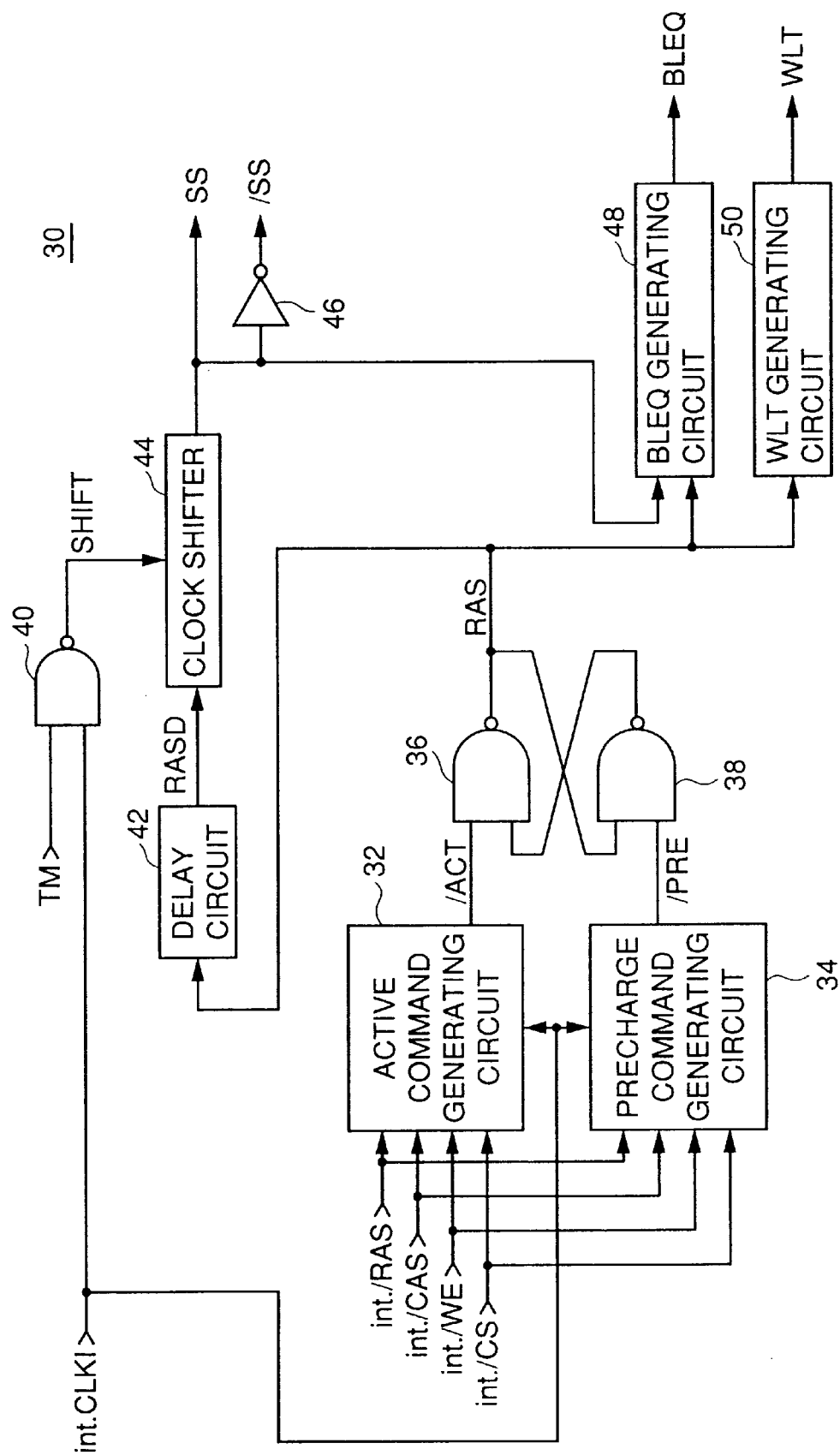
FIG. 3 is a block diagram showing a structure of a row selection timing generating circuit 30 of semiconductor memory device 1.

FIG. 3 is a block diagram showing a structure of row selection timing generating circuit 30 of semiconductor memory device 1.

Referring to FIG. 3, row selection timing generating circuit 30 is included in control circuit 8 shown in FIG. 1, and includes an active command generating circuit 32 and a precharge command generating circuit 34, which latch control signals int./RAS, int./CAS, int./WE and int./CS in synchronization with clock signal int.CLKI, and issue an active command ACT and a precharge command PRE, respectively, as well as NAND circuits 36 and 38 which are cross-coupled, and receive signal /ACT sent from active command generating circuit 32 and signal /PRE sent from precharge command generating circuit 34, respectively, and a delay circuit 42 which delays a signal RAS sent from NAND circuit 36 for issuing a signal RASD.

Row selection timing generating circuit 30 further includes a NAND circuit 40 which receives clock signal int.CLKI and a test mode signal TM, and issues a signal SHIFT, a clock shifter 44 which issues a sense amplifier activating signal SS in accordance with signals RASD and SHIFT, an inverter 46 which inverts sense amplifier activating signal SS to issue a sense amplifier activating signal /SS, a BLEQ generating circuit 48 which generates equalize signal BLEQ in accordance with sense amplifier activating signal SS and signal RAS, and a WLT generating circuit 50 which issues a signal WLT indicating timing, according to which the word line is activated, in accordance with signal RAS.

Figure 4:
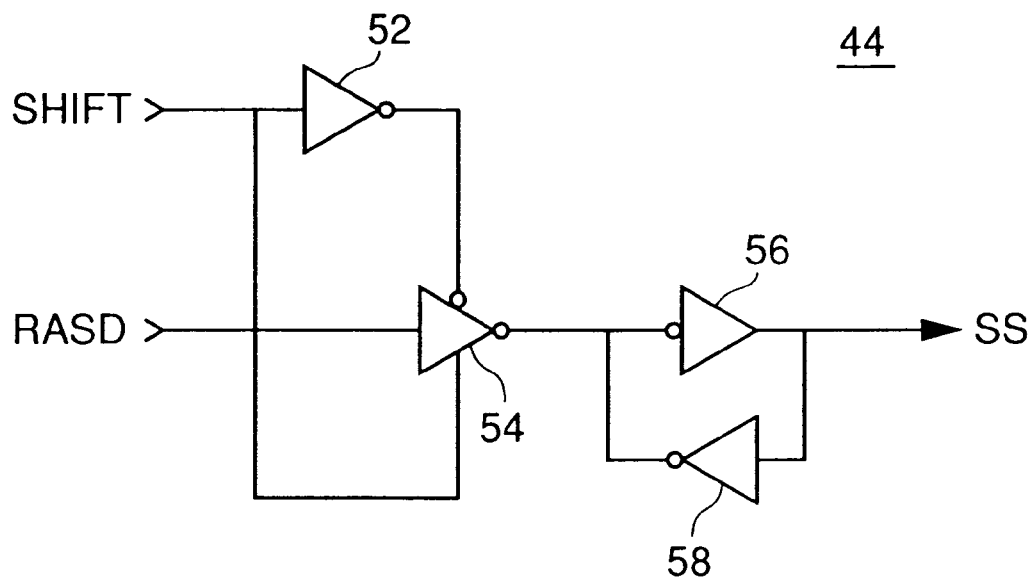
FIG. 4 is a circuit diagram showing a structure of a clock shifter 44 shown in FIG. 3.

FIG. 4 is a circuit diagram showing a structure of clock shifter 44 shown in FIG. 3.

Referring to FIG. 4, clock shifter 44 includes an inverter 52 which receives and inverts signal SHIFT, a clocked inverter 54 which is activated to invert and issue signal RASD in accordance with the output of inverter 52 and signal SHIFT, an inverter 56 which issues sense amplifier activating signal SS by receiving and inverting the output of clocked inverter 54, and an inverter 58 which receives and inverts the output of inverter 56 for sending it to the input of inverter 56.

Clock shifter 44 holds the last value of sense amplifier activating signal SS for a period after change of signal RASD and until activation of clocked inverter 54 by signal SHIFT. More specifically, clock shifter 44 delays the output of signal RASD until signal SHIFT changes.

FIG. 5 shows commands which are recognized in accordance with external input signals applied to semiconductor memory device 1.

Referring to FIG. 5, when control signals int./CS, int./RAS, int./CAS and int./WE are at the levels of H, X, X and X, respectively, a command NOP (non-operation) is recognized. "X" represents that the signal may be either at H-level or L-level.

When control signals int./CS, int./RAS, int./CAS and int./WE are at L-, H-, H- and H-levels, respectively, command NOP is recognized. When control signal int./CS is at H-level as described above, semiconductor memory device 1 cannot accept commands such as a read command and a write command. This state can be achieved by an appropriate combination of control signals int./RAS, int./CAS and int./WE even when control signal int./CS is at L-level.

When control signals int./CS, int./RAS, int./CAS and int./WE are at L-, L-, H- and H-levels, respectively, command ACT is recognized. Command ACT is a row active command for activating the row in the bank designated by the bank address.

When control signals int./CS, int./RAS, int./CAS and int./WE are at L-, L-, H- and L-levels, respectively, command PRE is recognized. Command PRE is used for deactivating the bank. When the bank is deactivated, the equalize circuits precharge the bit line pairs in the bank.

When control signals int./CS, int./RAS, int./CAS and int./WE are at L-, H-, L- and H-levels, respectively, command READ is recognized. Command READ instructs reading of data from the activated bank.

When control signals int./CS, int./RAS, int./CAS and int./WE are at L-, H-, L- and L-levels, respectively, command WRITE is recognized. Command WRITE instructs writing of data into the activated bank.

Figure 6:
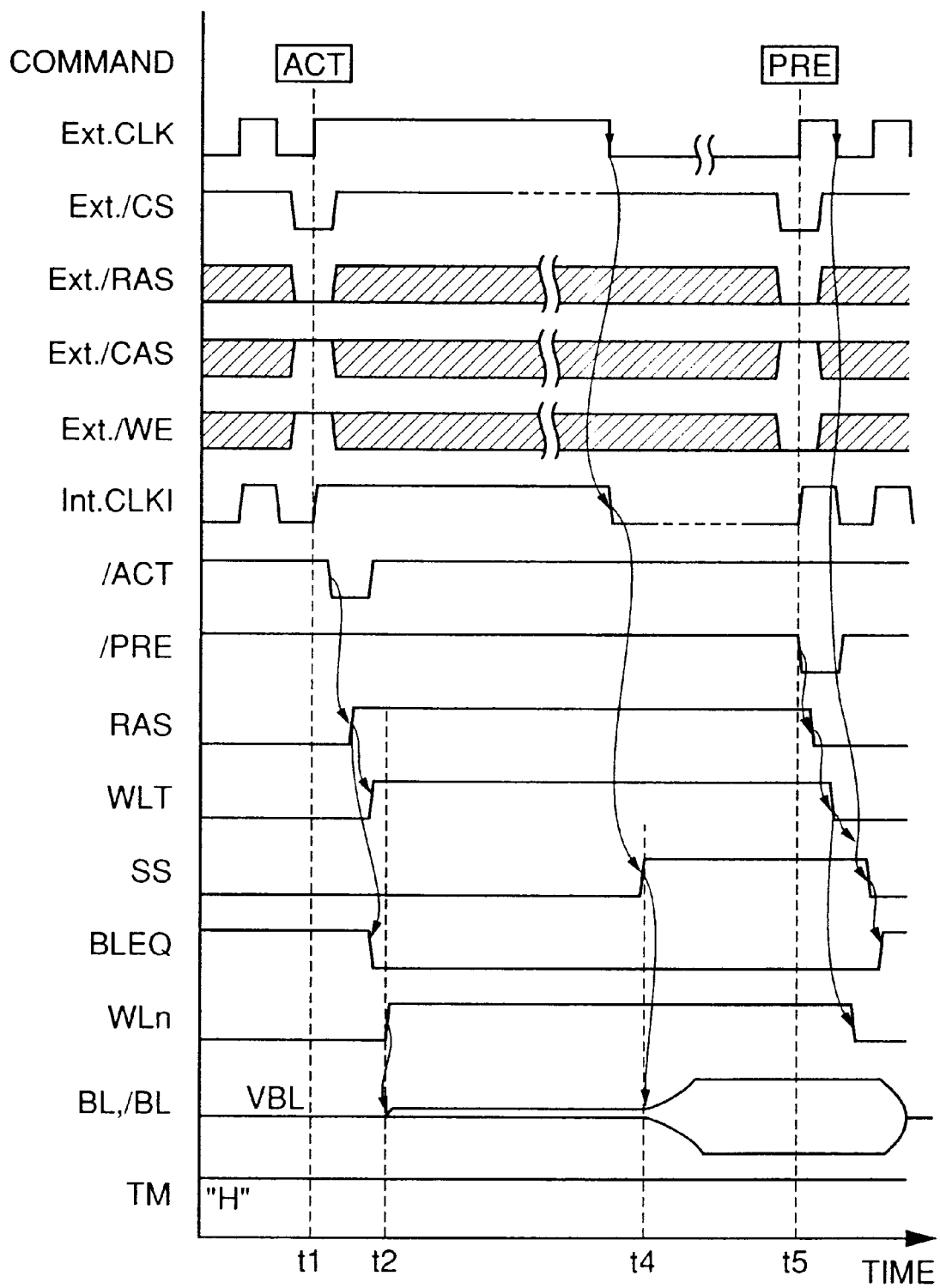
FIG. 6 is an operation waveform diagram for showing an operation of row selection timing generating circuit 30 during the test.

FIG. 6 is an operation waveform diagram for showing an operation of row selection timing generating circuit 30 during the test.

Referring to FIGS. 3 and 6, test mode signal TM is set to H-level during the test operation. At a time t1, command ACT which is determined by the combination of control signals int./RAS, int./CAS, int./WE and int./CS is supplied so that active command generating circuit 32 activates signal /ACT to attain L-level. Thereby, the latch circuit formed of NAND circuits 136 and 138 latches signal /ACT, and raises signal RAS from L-level to H-level.

Equalize signal BLEQ which equalizes and precharges the bit line pair to potential VBL is triggered by the rising of signal RAS to lower to L-level so that the bit line pair is released from the precharged state, and enters a floating state.

Thereafter, signal WLT rises to H-level, and the row decoder for selecting the memory cell row selects one word line WLn to raise the potential thereon to H-level at a time t2. When word line WLn is activated to H-level, the data written in the memory cell is transmitted onto the bit line pair so that a minute potential difference occurs on the bit line pair. If the operation is in the normal operation mode, test mode signal TM is set to L-level, and signal SHIFT in FIG. 3 is at H-level so that clocked inverter 54 in FIG. 4 is always active, and the sense amplifier is activated after the delay time of delay circuit 42 to amplify the potential difference occurring between the bit lines.

In the test mode, however, test mode signal TM is set to H-level so that signal SHIFT changes in accordance with clock signal int.CLKI. Accordingly, change in externally applied clock signal Ext.CLK is temporarily stopped after input of the clock edge for recognizing command ACT at time t1 so that clock signal int.CLKI may be held at H-level. Thereby, the minute potential difference which occurs on the bit line pair is not amplified by the sense amplifier, and thus does not change.

In the case where a minute leak occurs from bit lines due to a defective structure, the potential difference decreases to fall within a range which cannot be amplified by the sense amplifier if the temporary stop time of clock signal Ext.CLK is increased to a certain extent.

At a time t4, input of clock signal Ext.CLK restarts so that internal clock int.CLKI falls to L-level, and signal SHIFT attains H-level so that sense amplifier activating signal SS rises to H-level, and the minute potential difference on the bit line pair is amplified. When the read command is supplied, the data on the bit line pair is externally output.

At this time, a minute leak failure may occur on the bit line. In this case, the sense amplifier does not perform the amplification corresponding to the data, resulting in a read failure.

At a time t5 after the read is completed, the precharge command is supplied for precharging the bit lines again and allowing the next read or write cycle.

According to the semiconductor memory device of the first embodiment, as described above, the externally applied clock signal is temporarily stopped in the test mode, and thereby the failure, which cannot be detected in a normal test of a synchronous semiconductor memory device, can be detected based on a minute leak occurring between the bit lines. Thereby, the minute leak can be found in the initial test before an acceleration test, and the burn-in test can be performed after performing replacement with a redundant memory cell row. Accordingly, a manufacturing yield after the acceleration test such as a burn-in test can be improved.

[Second Embodiment]

Figure 7:
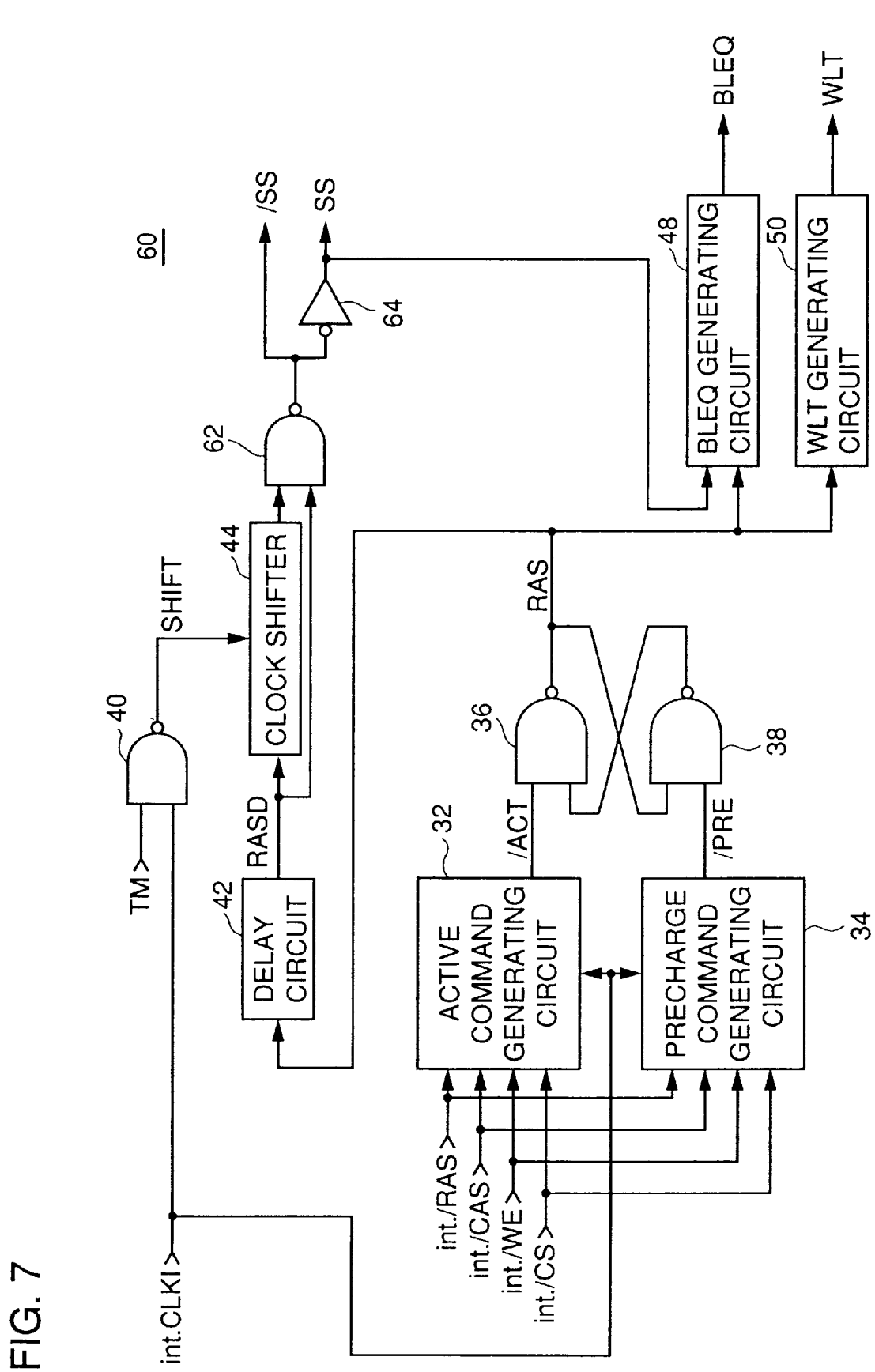
FIG. 7 is a block diagram showing a structure of a row selection timing generating circuit 60 used in a second embodiment.

FIG. 7 is a block diagram showing a structure of a row selection timing generating circuit 60 used in a second embodiment.

Referring to FIG. 7, row selection timing generating circuit 60 differs from row selection timing generating circuit 30 shown in FIG. 3 in that an NAND circuit 62 and an inverter 64 are employed instead of inverter 46.

NAND circuit 62 receives signal RASD issued from delay circuit 42 and the output of clock shifter 44, and issues sense amplifier activating signal /SS. Inverter 64 inverts sense amplifier activating signal /SS to issue sense amplifier activating signal SS.

Structures of row selection timing generating circuit 60 other than the above are the same as those of row selection timing generating circuit 30, and therefore description thereof is not repeated.

Figure 8:
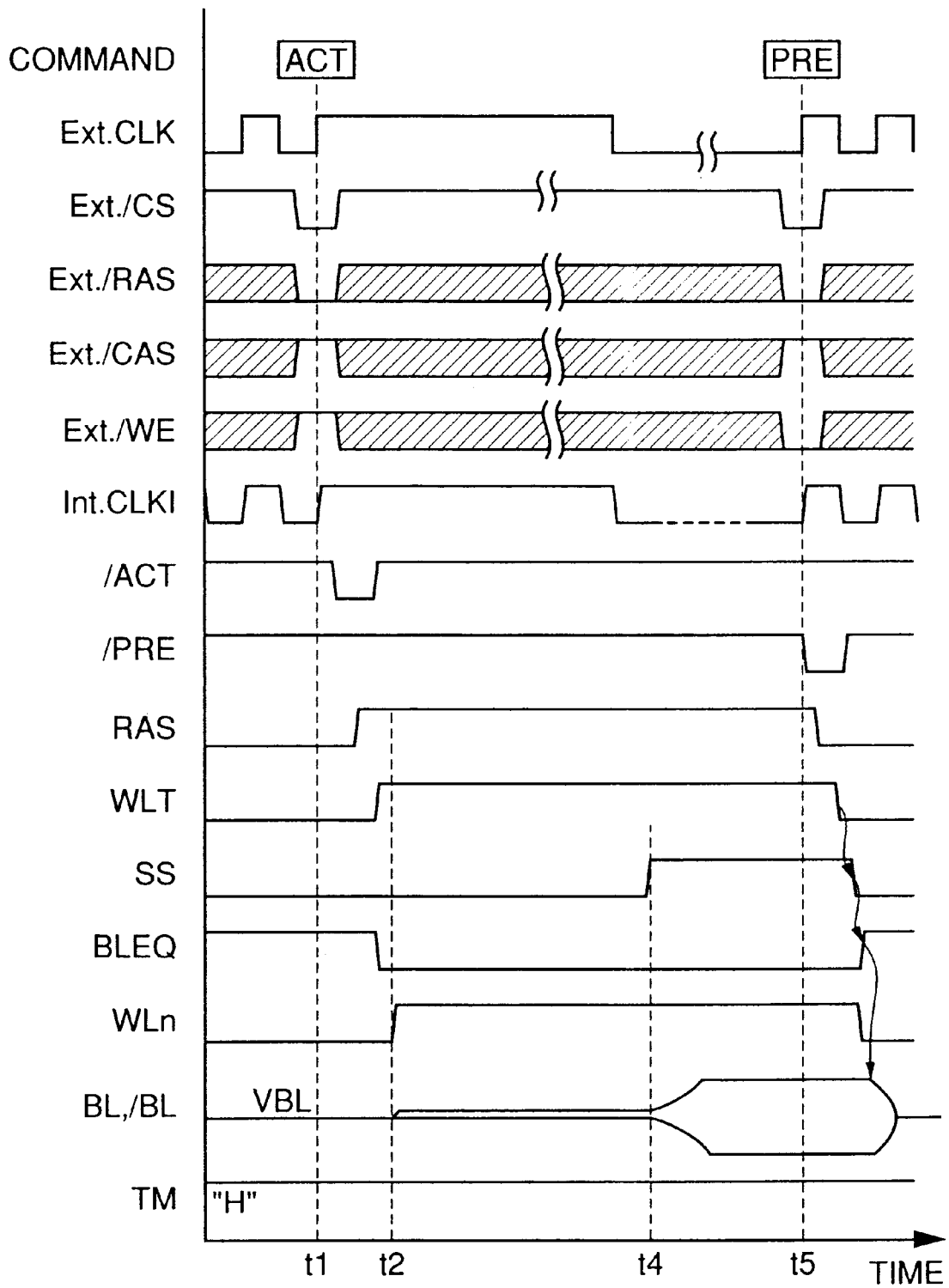
FIG. 8 is an operation waveform diagram for showing an operation of row selection timing generating circuit 60 during the test.

FIG. 8 is an operation waveform diagram for showing an operation of row selection timing generating circuit 60 during the test.

Referring to FIGS. 7 and 8, input of command ACT, activation of the word line and activation of the sense amplifier are successively performed for a period from time t1 to time t4, as already described with reference to FIG. 6.

At time t5, command PRE is recognized in synchronization with rising of the dock signal. In the case of the first embodiment, clock shifter 44 delays the signal at both the times of rising and falling of signal RASD, and therefore the deactivation of sense amplifier activating signal SS and the reentry in the precharged state are performed after a clock edge following the clock edge at which command PRE was input.

In the second embodiment, NAND circuit 62 can serve to deactivate sense amplifier activating signal SS in response to the falling of signal RASD prior to change in output of the clock shifter. Accordingly, precharging of the bit line pair is executed in response to equalize signal BLEQ, and the state ready for the next operation can be attained at an early time so that the operation speed can be increased.

[Third Embodiment]

Figure 9:
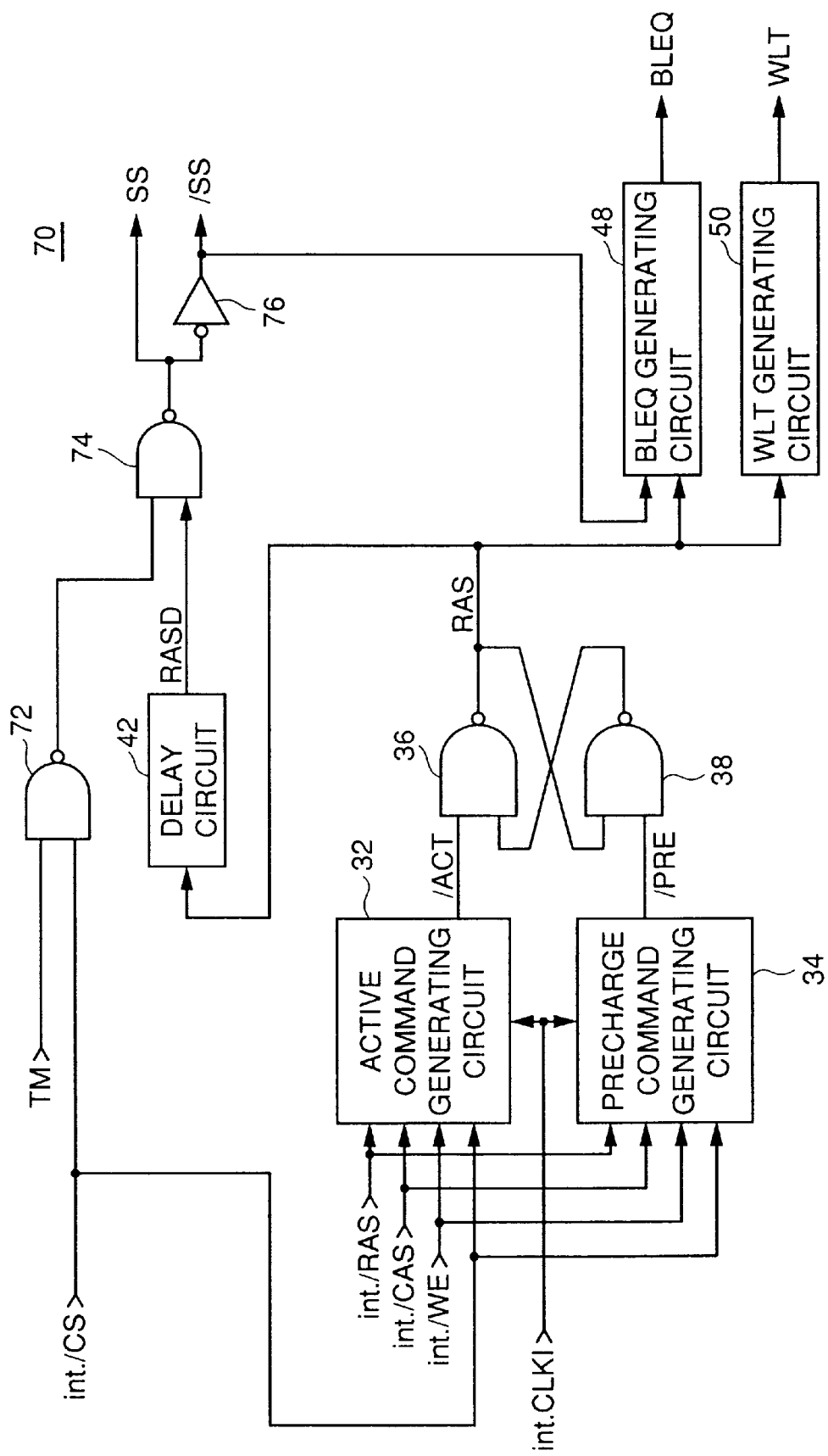
FIG. 9 is a block diagram showing a structure of a row selection timing generating circuit 70 used in a third embodiment.

FIG. 9 is a block diagram showing a structure of row selection timing generating circuit 70 used in a third embodiment of the invention.

Referring to FIG. 9, row selection timing generating circuit 70 differs from row selection timing generating circuit 60 in that NAND circuits 72 and 74 as well as inverter 76 are employed instead of NAND circuit 40, clock shifter 44, NAND circuit 62 and inverter 62.

NAND circuit 72 receives test mode signal TM and control signal int./CS. NAND circuit 74 receives signal RASD sent from delay circuit 42 and the output of NAND circuit 72, and issues sense amplifier activating signal /SS. Inverter 76 inverts sense amplifier activating signal /SS, and issues sense amplifier activating signal SS.

Structures of row selection timing generating circuit 70 other than the above are the same as those of row selection timing generating circuit 60 shown in FIG. 7, and therefore description thereof is not repeated.

Figure 10:
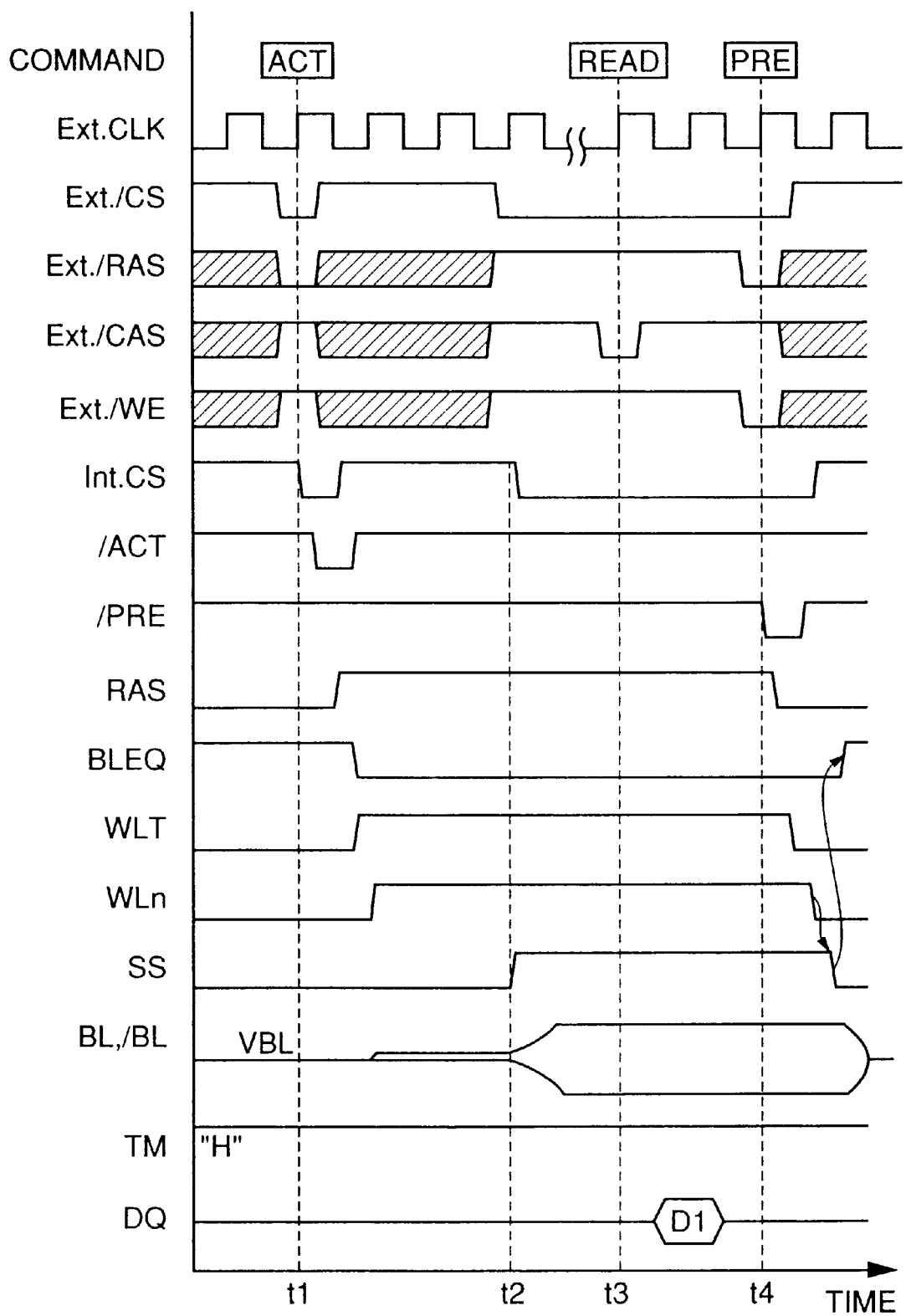
FIG. 10 is an operation waveform diagram for showing an operation of row selection timing generating circuit 70 during the test.

FIG. 10 is an operation waveform diagram for showing an operation of row selection timing generating circuit 70 during the test.

Referring to FIGS. 9 and 10, input of command ACT, activation of the word line and activation of the sense amplifier are successively performed for a period from time t1 to time t4, as already described with reference to FIG. 6. However, control signal Ext./CS determines the timing of activation of the sense amplifier. Thus, control signal Ext./CS is temporarily set to L-level for entry of command ACT at time t1, and thereafter is set to H-level again.

At time t2, control signals Ext./RAS, Ext./CAS and Ext./WE are all set to H-level. Thereby, the non-operation state is maintained even if control signal Ext./CS is set to L-level, as already described with reference to FIG. 5. When control signal Ext./CS is set to L-level, the output of NAND circuit 72 attains H-level so that signal RASD which is at H-level is transmitted as sense amplifier activating signal SS. Therefore, it is possible to delay the timing according to which the sense amplifier amplifies the minute potential difference on the bit line pair in accordance with control signal Ext./CS. Accordingly, the minute leak occurring from the bit line can be detected in the test.

At time t3, read command READ is input for externally supplying the data of the memory cell read onto the bit line pair. Read command READ can be recognized by lowering control signal Ext./CAS to L-level and keeping control signals Ext./RAS and Ext./WE at H-level. Thereby, data D1 is read onto a terminal DQ after one clock, if the CAS latency is equal to one.

At time t4, command PRE is recognized in synchronization with the rising of clock signal. The bit line pair is precharged in accordance with equalize signal BLEQ for achieving the state ready to the next operation.

According to the third embodiment, as already described, control signal Ext./CS for the chip selection can be used for instructing the activation timing of the sense amplifier, and the test can be performed for detecting the minute leak from the bit line in the test operation. Accordingly, the test can be executed without changing the frequency of the clock signal during the test.

[Fourth Embodiment]

Figure 11:
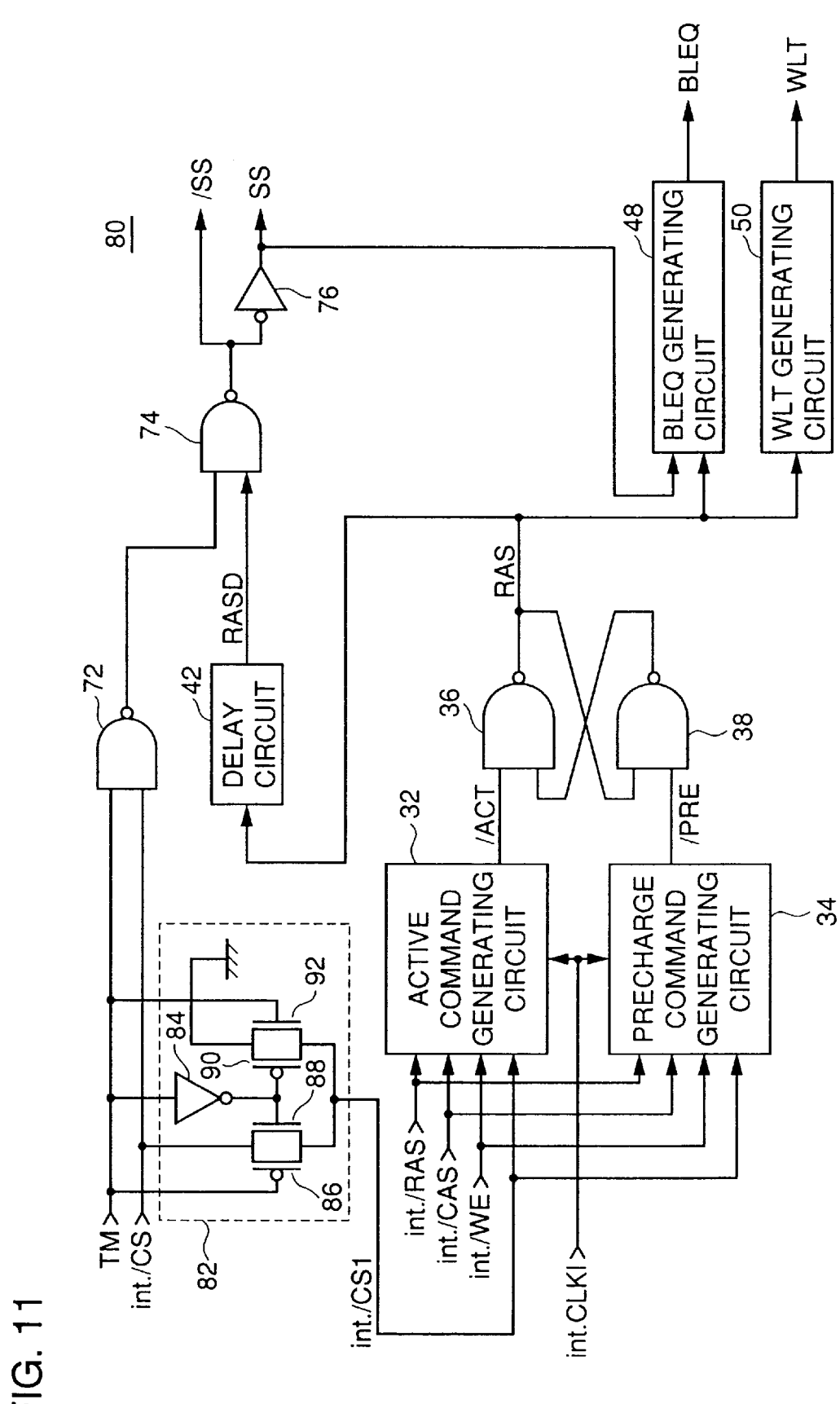
FIG. 11 is a block diagram showing a structure of a row selection timing generating circuit 80 used in a fourth embodiment.

FIG. 11 is a block diagram showing a structure of a row selection timing generating circuit 80 used in a fourth embodiment.

Referring to FIG. 11, row selection timing generating circuit 80 differs from row selection timing generating circuit 70 shown in FIG. 9 in that an internal signal switch circuit 82 is further employed, and active command generating circuit 32 and precharge command generating circuit 34 receive a signal int./CS1 instead of control signal int./CS.

Internal signal switch circuit 82 includes an inverter 84, which receives and inverts test mode signal TM, and P- and N-channel MOS transistors 86 and 88, which are turned on in accordance with test mode signal TM and the output of inverter 84, respectively, and thereby transmit control signal int./CS as signal int./CS1 to active command generating circuit 32 and precharge command generating circuit 34.

Internal signal switch circuit 82 further includes N- and P-channel MOS transistors 92 and 90, which are turned on in response to test mode signal TM and the output of inverter 84, respectively, and thereby transmit the L-level at the ground potential to active command generating circuit 32 and precharge command generating circuit 34 as signal int./CS1.

Structures of row selection timing generating circuit 80 other than the above are the same as those of row selection timing generating circuit 70 shown in FIG. 9, and therefore description thereof is not repeated.

FIG. 12 shows commands which are recognized in accordance with external input signals applied to the semiconductor memory device of the fourth embodiment.

Referring to FIG. 12, when control signals int./CS, int./RAS, int./CAS and int./WE are at X-, H-, H- and H-levels, respectively, command NOP (non-operation) is recognized. "X" represents that the signal may be either at H- or L-level.

When control signals int./CS, int./RAS, int./CAS and int./WE are at X-, L-, H- and H-levels, respectively, command ACT is recognized. Command ACT is the row active command for activating the row in the bank designated by the bank address.

When control signals int./CS, int./RAS, int./CAS and int./WE are at X-, L-, H- and L-levels, respectively, command PRE is recognized. Command PRE is used for deactivating the bank. When the bank is deactivated, the equalize circuits precharge the bit line pairs in the bank.

When control signals int./CS, int./RAS, int./CAS and int./WE are at X-, H-, L- and H-levels, respectively, command READ is recognized. Command READ instructs reading of data from the activated bank.

When control signals int./CS, int./RAS, int./CAS and int./WE are at X-, H-, L- and L-levels, respectively, command WRITE is recognized. Command WRITE instructs writing of data into the activated bank.

In the row selection timing generating circuit 80 shown in FIG. 11, since internal signal int./CS1 is set to L-level in the test mode as described above, active command generating circuit 32, precharge command generating circuit 34 and others can recognize the commands regardless of the state of control signal Ext./CS1 which is externally applied. In the test mode, therefore, the operation of delaying the timing of the sense amplifier activating signal in accordance with control signal Ext./CS can be performed independently of the operations of inputting commands such as commands READ and WRITE. Therefore, the commands such as commands READ and WRITE can be input more easily.

Figure 13:
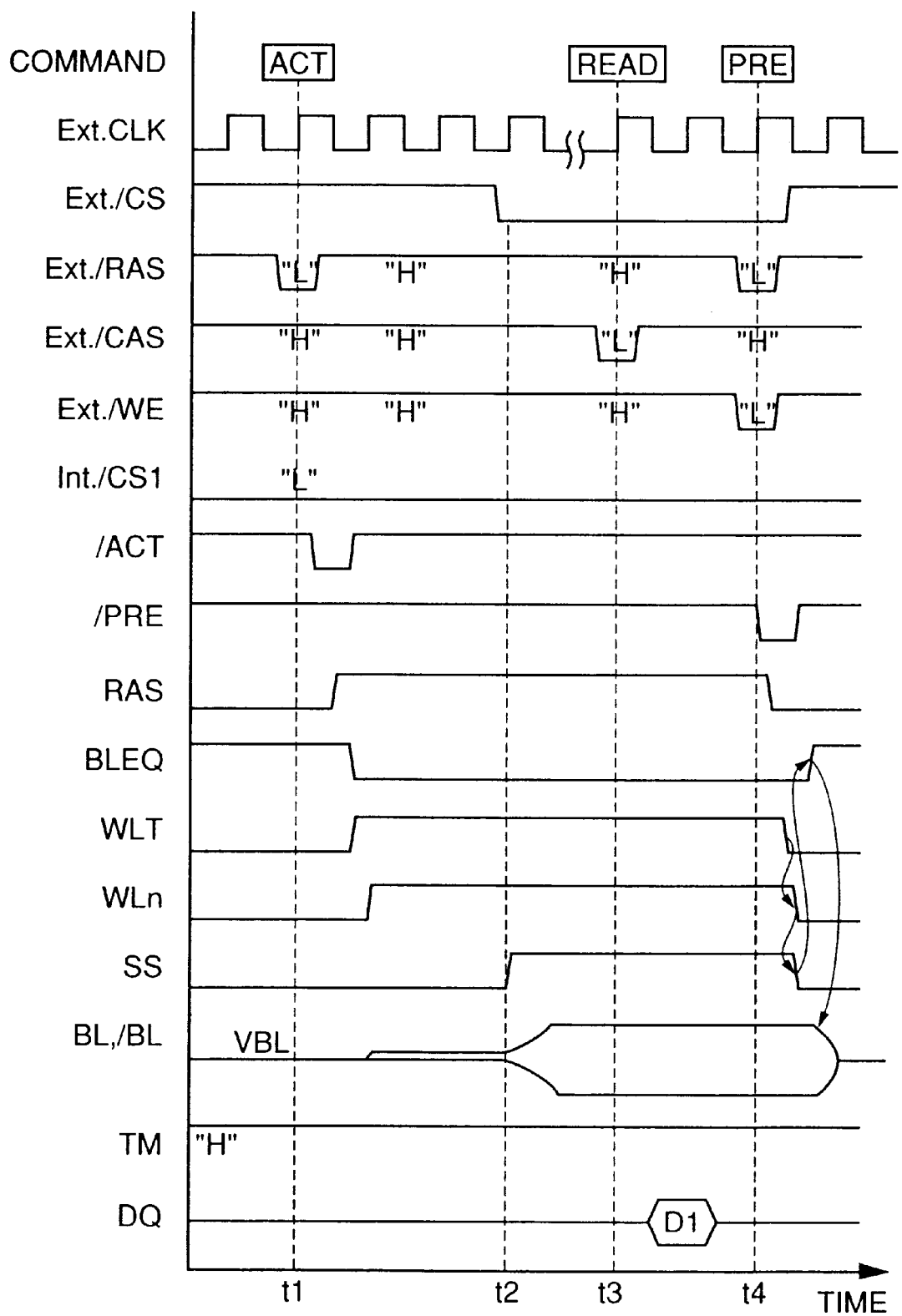
FIG. 13 is an operation waveform diagram for showing an operation of row selection timing generating circuit 80 during the test.
Figure 14:
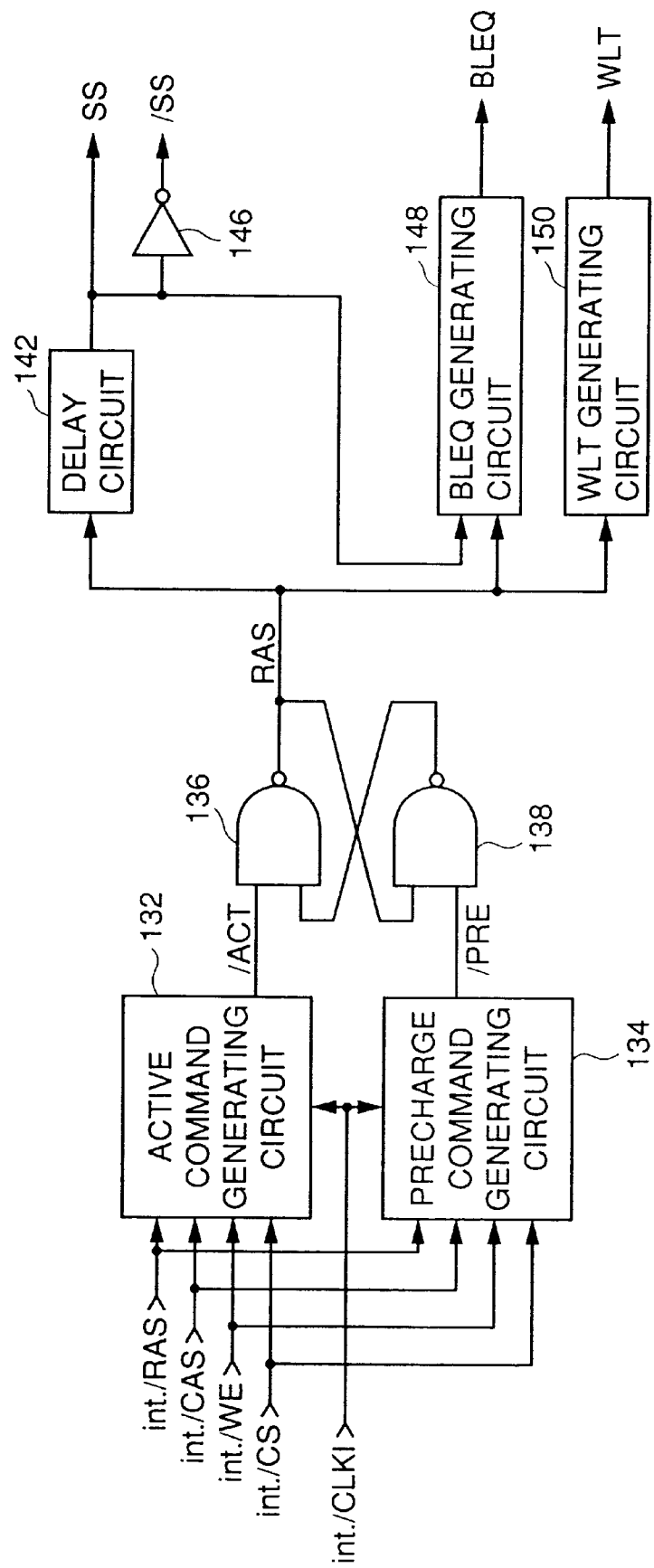
FIG. 14 shows a circuit for generating row selection timing of a semiconductor memory device in the prior art.
Figure 15:
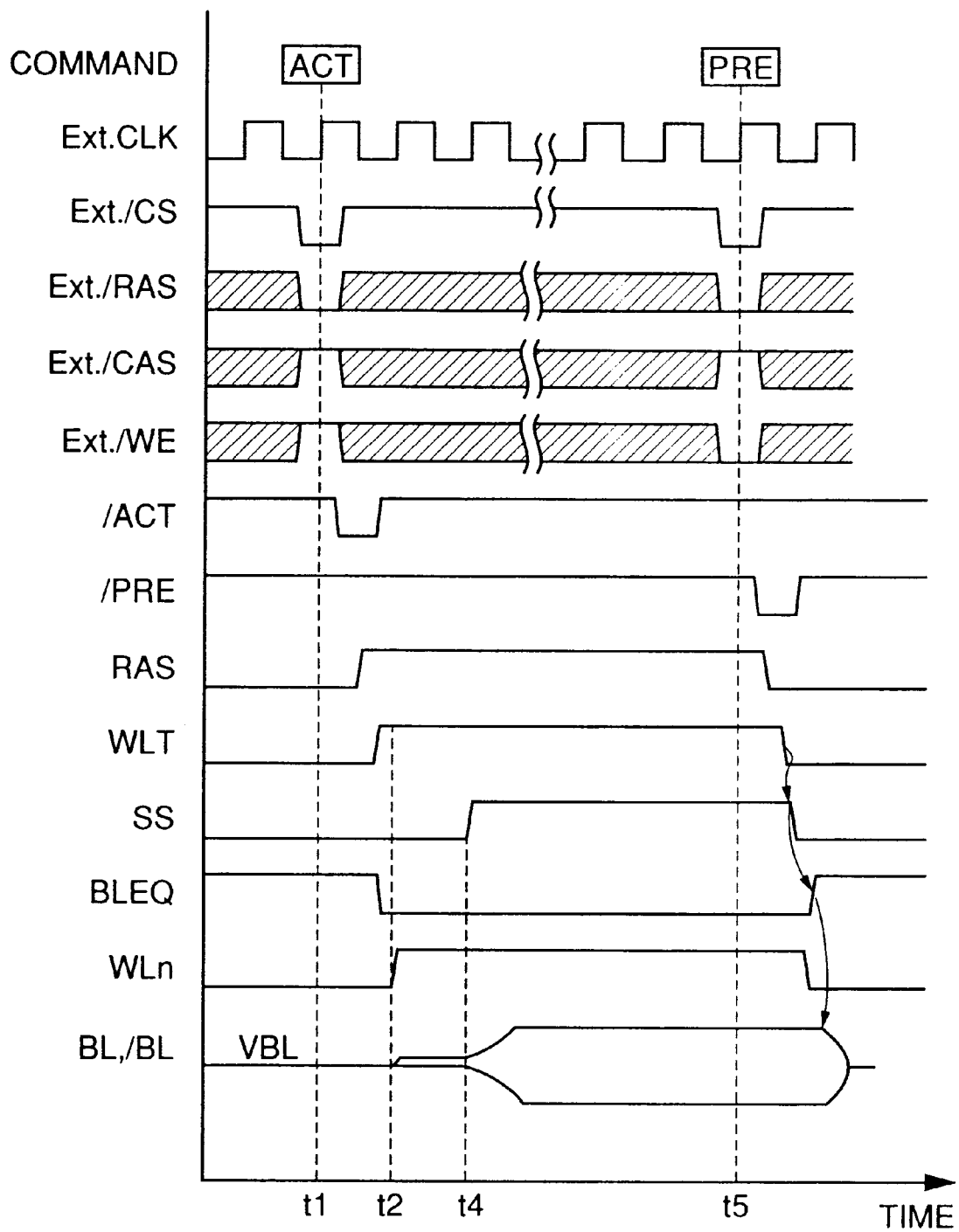
FIG. 15 is an operation waveform diagram for showing a row selecting operation of the semiconductor memory device in the prior art.

FIG. 13 is an operation waveform diagram for showing an operation of row selection timing generating circuit 80 during the test.

Referring to FIGS. 11 and 13, test mode signal TM is set to H-level in the test operation for detecting a minute leak from the bit line. Thereby, signal int./CS1 is internally set to L-level. At time t1, control signals Ext./RAS, Ext./CAS and Ext./WE are set to L-, H- and H-levels, respectively, so that command ACT is input. After the input of command ACT, control signals Ext./RAS, Ext./CAS and Ext./WE are all set to H-level so that NOP (non-operation) command is input. The equalized state of the bit line pair is released, and thereafter the word line is activated so that a minute potential difference corresponding to the data of the memory cell occurs on the bit line pair.

At time t2, control signal Ext./CS lowers to L-level so that sense amplifier activating signal SS attains H-level, and thereby the minute potential difference on the bit line pair is amplified by the sense amplifier. Accordingly, the timing according to which the sense amplifier amplifies the minute potential difference on the bit line pair can be determined in accordance with control signal Ext./CS, and therefore the minute leak occurring from the bit line can be detected in the test.

At time t3, read command READ is input for externally outputting the data of memory cell read onto the bit line pair. Read command READ can be recognized by lowering control signal Ext./CAS to L-level and keeping control signals Ext./RAS and Ext./WE at H-level. Thereby, data D1 is read onto terminal DQ after one dock, if the CAS latency is equal to one.

At time t4, command PRE is recognized in synchronization with the rising of clock signal. The bit line pair is precharged in accordance with equalize signal BLEQ for achieving the state ready to the next operation.

According to the fourth embodiment, as already described, control signal Ext./CS for the chip selection can be used for instructing the activation timing of the sense amplifier, and the test can be performed for detecting the minute leak from the bit line in the test operation. Further, signal int./CS1 transmitted to the command generating circuit is internally generated. Therefore, the read command, the write command and others can be input easily.

In the fourth embodiment described above, control signal Ext./CS controls the start of operation of the sense amplifier. However, it is not restricted to control signal Ext./CS, and it is possible to use signal CKE or the like other than special function control signals, i.e., other than the signals used for control of normal reading or writing of data into or from the memory cells. In the case of using signal CKE or the like, intended effects can be achieved by internally providing a circuit for issuing internal set signals in accordance with the test signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device receiving a command in synchronization with a clock signal, comprising:
   a memory array including a plurality of memory cells arranged in a matrix form having a plurality of rows and a plurality of columns, a plurality of word lines corresponding to said plurality of rows, respectively, and a plurality of bit line pairs corresponding to said plurality of columns, respectively;
   a plurality of equalize circuits applying predetermined potentials to said plurality of bit line pairs, respectively;
   a plurality of sense amplifiers for amplifying potential differences occurring on said plurality of bit line pairs, respectively; and
   a control circuit for controlling reading of data from said memory array, said control circuit including
   a command recognizing portion recognizing said command in accordance with a combination of a plurality of externally applied control signals, and issuing a timing reference signal providing a reference of timing of deactivation of said plurality of equalize circuits, activation of one of said plurality of word lines selected in accordance with an address signal, and activation of said plurality of sense amplifiers,
   a delay circuit receiving and delaying said timing reference signal, and
   a signal delay control circuit delaying the output of said delay circuit until activation of a first internal signal, and transmitting the delayed output to said plurality of sense amplifiers.

2. The semiconductor memory device according to claim 1, wherein
   said control circuit further includes a first gate circuit issuing said first internal signal in accordance with said clock signal in a test operation, and fixing said first internal signal at an active state in a normal operation.

3. The semiconductor memory device according to claim 2, wherein
   said control circuit further includes a second gate circuit receiving the output of said delay circuit and the output of said signal delay control circuit, activating said plurality of sense amplifiers in accordance with the output of said signal delay control circuit when said timing reference signal is active, and deactivating said plurality of sense amplifiers in accordance with the output of said delay circuit when said timing reference signal is inactive.

4. The semiconductor memory device according to claim 3, wherein
   said signal delay control circuit includes a clocked inverter being activated to invert the output of said delay circuit in accordance with said first internal signal, and
   said second gate circuit includes an NAND circuit receiving the output of said delay circuit and the output of said signal delay control circuit.

5. The semiconductor memory device according to claim 1, wherein
   said control circuit further includes a first gate circuit issuing said first internal signal in accordance with a first external control input signal formed of one of said plurality of control signals in a test operation, and fixing said first internal signal at an active state in a normal operation.

6. The semiconductor memory device according to claim 5, wherein
   said signal delay control circuit includes:
   an NAND circuit receiving said first internal signal and the output of said delay circuit, and
   an inverter inverting the output of said NAND circuit to issue a signal activating said sense amplifier.

7. The semiconductor memory device according to claim 5, wherein
   said control circuit further includes an internal signal switch circuit transmitting said first external control input signal to said command recognizing portion in said normal operation, and issuing a first internal control input signal to said command recognizing portion instead of said first external control input signal.

8. The semiconductor memory device according to claim 7, wherein
   said first external control input signal is an externally applied chip select signal,
   said command recognizing portion recognizes an active command for the row activation in accordance with a combination of said plurality of control signals when said chip select signal attains a low level in said normal operation, and
   said internal signal switch circuit sets said first internal control input signal to the low level in said test operation.

* * * * *